United States Patent
Saini et al.

(10) Patent No.: US 12,223,244 B1
(45) Date of Patent: Feb. 11, 2025

(54) SYSTEM AND METHOD FOR INTERACTIVE VISUALIZATION OF PLACEMENT OF OBJECTS IN AN ELECTRONIC DESIGN

(71) Applicant: Cadence Design Systems, Inc., San Jose, CA (US)

(72) Inventors: Nikita Saini, Noida (IN); Tapan Kumar Singh, Noida (IN); Devendra Ramakant Deshpande, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 191 days.

(21) Appl. No.: 17/483,349

(22) Filed: Sep. 23, 2021

(51) Int. Cl.
*G06F 30/31* (2020.01)
*G06F 3/0482* (2013.01)
*G06F 3/04845* (2022.01)
*G06F 30/392* (2020.01)

(52) U.S. Cl.
CPC ............ *G06F 30/31* (2020.01); *G06F 3/0482* (2013.01); *G06F 3/04845* (2013.01); *G06F 30/392* (2020.01)

(58) Field of Classification Search
CPC ........ G06F 30/31; G06F 30/30; G06F 30/392; G06F 30/39; G06F 3/0482; G06F 3/0481; G06F 3/04845; G06F 3/0484
USPC ................ 716/100, 101, 102, 110, 118, 119; 715/764, 964
See application file for complete search history.

(56) References Cited

U.S. PATENT DOCUMENTS

| | | | | |
|---|---|---|---|---|
| 8,595,662 B1* | 11/2013 | Yu | ............................ | G06F 30/39 716/110 |
| 9,053,289 B1* | 6/2015 | Lamant | ................ | G06F 3/04845 |
| 10,255,402 B1* | 4/2019 | Rossman | .............. | G06F 30/392 |
| 10,515,177 B1* | 12/2019 | Ruehl | .................... | G06F 30/398 |
| 10,515,180 B1* | 12/2019 | Sharma | .................... | G06T 3/153 |
| 10,685,463 B1* | 6/2020 | Buchner | ................. | G06T 11/60 |
| 2010/0205575 A1* | 8/2010 | Arora | ....................... | G06F 30/39 716/139 |
| 2014/0096012 A1* | 4/2014 | Grosz | .................. | G06F 3/04845 715/733 |
| 2014/0189617 A1* | 7/2014 | Rashingkar | ............. | G06F 30/31 716/102 |
| 2015/0026618 A1* | 1/2015 | Stone | ................... | G06F 3/04845 715/769 |
| 2015/0268744 A1* | 9/2015 | Au | ........................... | G06F 3/041 345/173 |
| 2016/0110077 A1* | 4/2016 | Stone | ................... | G06F 3/04883 715/769 |

(Continued)

FOREIGN PATENT DOCUMENTS

KR 2017113344 A * 10/2017 ......... G06F 17/5072

*Primary Examiner* — Hwei-Min Lu
(74) *Attorney, Agent, or Firm* — Mark H. Whittenberger; Holland & Knight LLP

(57) ABSTRACT

Embodiments included herein are directed towards a method for visualizing an electronic circuit design. Embodiments may include causing a display of a portion of an electronic design at a graphical user interface and receiving, at the graphical user interface, a selection of an object to be moved, wherein the object is displayed in a first color. In response to a user input, embodiments may include moving the object at the graphical user interface nearer a target location, displaying at least one target type in a second color and snapping the object to the target location.

20 Claims, 16 Drawing Sheets
(14 of 16 Drawing Sheet(s) Filed in Color)

(56) References Cited

U.S. PATENT DOCUMENTS

| | | | |
|---|---|---|---|
| 2016/0147926 A1* | 5/2016 | Chiang | G06F 30/392 |
| | | | 716/122 |
| 2016/0179336 A1* | 6/2016 | Ambrus | G02B 27/017 |
| | | | 715/768 |
| 2017/0098025 A1* | 4/2017 | Cassard | G06F 30/392 |
| 2017/0286584 A1* | 10/2017 | Lefferts | G06F 30/31 |
| 2017/0344689 A1* | 11/2017 | Basaran | G06F 30/392 |

* cited by examiner

10

causing a display of a portion of an electronic design at a graphical user interface

202

receiving, at the graphical user interface, a selection of an object to be moved, wherein the object is displayed in a first color

204

in response to user input, moving the object at the graphical user interface nearer a target location

206

displaying at least one target type in a second color

208

snapping the object to the target location

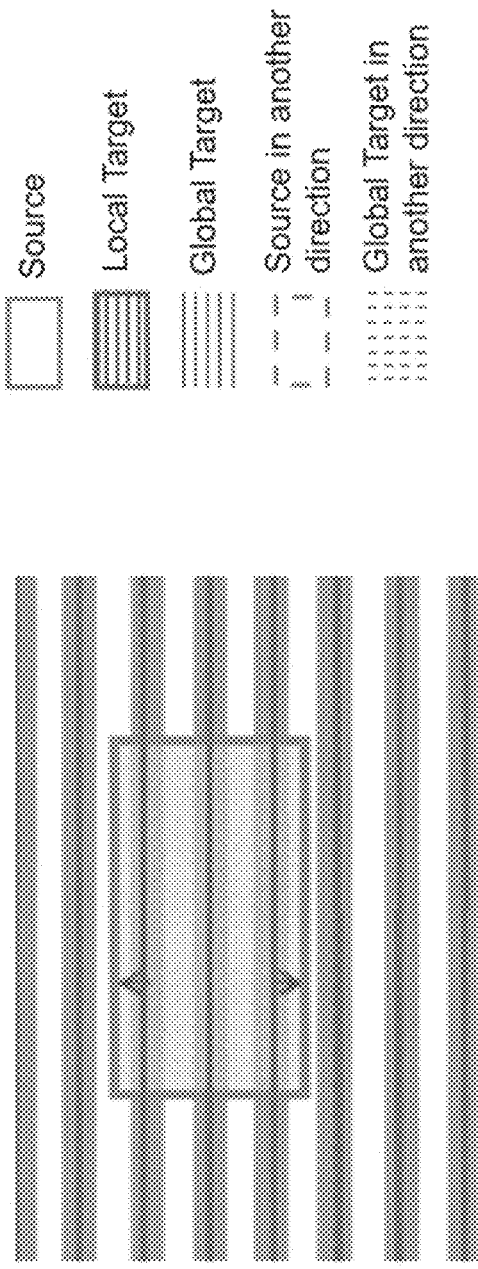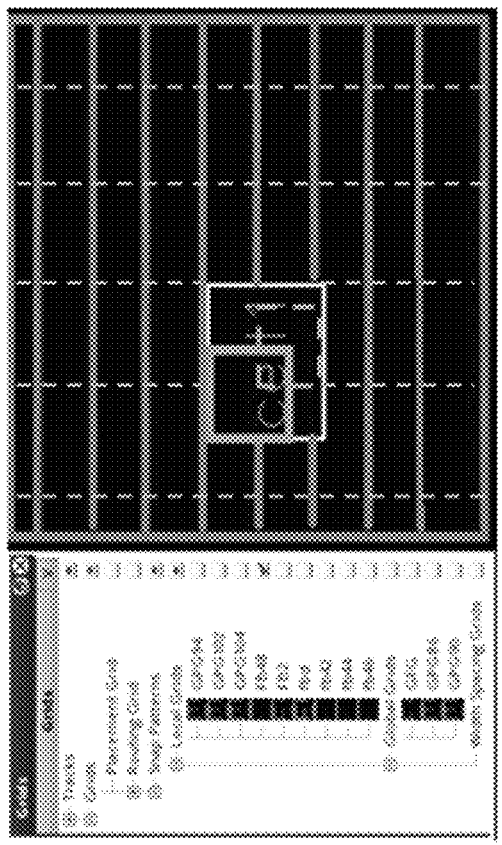
FIG. 13

SYSTEM AND METHOD FOR INTERACTIVE VISUALIZATION OF PLACEMENT OF OBJECTS IN AN ELECTRONIC DESIGN

FIELD OF THE INVENTION

The present disclosure relates to a method of electronic circuit design, and more particularly, to a visualization process associated with an electronic design.

BACKGROUND

Electronic designers often use various graphical user interfaces while creating and/or editing a particular design. These layout tools may allow a designer to create and/or edit various objects and move them around in a design. The ability of a tool to "snap" an object to a particular location is a useful feature that assists the user in determining the proper placement for an object within a design, which may involve numerous components displayed within the graphical user interface. One problem with snapping is that it is difficult for a user to figure out which object is snapped and to what grid it is associated with. Multiple types of grids in the design makes it a complex problem.

SUMMARY

In one or more embodiments of the present disclosure, a computer-implemented method for visualizing an electronic circuit design is provided. The method may include causing a display of a portion of an electronic design at a graphical user interface and receiving, at the graphical user interface, a selection of an object to be moved, wherein the object is displayed in a first color. In response to a user input, the method may include moving the object at the graphical user interface nearer a target location, displaying at least one target type in a second color and snapping the object to the target location.

One or more of the following features may be included. In some embodiments, the object may be at least one of a shape, a boundary, an instance, a row, a via, or a composite object. The target may be at least one of a local snap pattern grid, a global snap pattern grid, a local width spacing pattern region, a global width spacing pattern grid, a placement grid, a manufacturing grid, or an XY grid. The at least one target type may include a plurality of target types, wherein each target type is displayed in a distinct color. The object may be assigned a distinct line style based upon, at least in part, one or more grids. Displaying at least one target type may include displaying a plurality of target types in distinct colors simultaneously. In some embodiments, the target may be a row.

In one or more embodiments of the present disclosure a computer-readable storage medium having stored thereon instructions, which when executed by a processor result in one or more operations for visualizing an electronic circuit design is provided. Operations may include causing a display of a portion of an electronic design at a graphical user interface and receiving, at the graphical user interface, a selection of an object to be moved, wherein the object is displayed in a first color. In response to a user input, operations may include moving the object at the graphical user interface nearer a target location, displaying at least one target type in a second color and snapping the object to the target location.

One or more of the following features may be included. In some embodiments, the object may be at least one of a shape, a boundary, an instance, a row, a via, or a composite object. The target may be at least one of a local snap pattern grid, a global snap pattern grid, a local width spacing pattern region, a global width spacing pattern grid, a placement grid, a manufacturing grid, or an XY grid. The at least one target type may include a plurality of target types, wherein each target type is displayed in a distinct color. The object may be assigned a distinct line style based upon, at least in part, one or more grids. Displaying at least one target type may include displaying a plurality of target types in distinct colors simultaneously. In some embodiments, the target may be a row.

In one or more embodiments of the present disclosure a system is provided. The system may include a memory and at least one processor configured to cause a display of a portion of an electronic design at a graphical user interface. The at least one processor may be configured to receive, at the graphical user interface, a selection of an object to be moved, wherein the object is displayed in a first color. In response to user input, the at least one processor may be further configured to move the object at the graphical user interface nearer a target location. The at least one processor may be further configured to display at least one target type in a second color and to snap the object to the target location.

One or more of the following features may be included. In some embodiments, the object may be at least one of a shape, a boundary, an instance, a row, a via, or a composite object. The target may be at least one of a local snap pattern grid, a global snap pattern grid, a local width spacing pattern region, a global width spacing pattern grid, a placement grid, a manufacturing grid, or an XY grid. The at least one target type may include a plurality of target types, wherein each target type is displayed in a distinct color. The object may be assigned a distinct line style based upon, at least in part, one or more grids. Displaying at least one target type may include displaying a plurality of target types in distinct colors simultaneously.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 2 is an exemplary flowchart of a visualization process according to an embodiment of the present disclosure;

FIG. 11 depicts an example showing color coding schemes according to an embodiment of the present disclosure;

FIGS. 12-13 depict examples of snapping according to an embodiment of the present disclosure; and FIGS. 14A-16B depicts exemplary graphical user interfaces according to embodiments of the present disclosure.

DETAILED DESCRIPTION

Figure 1:
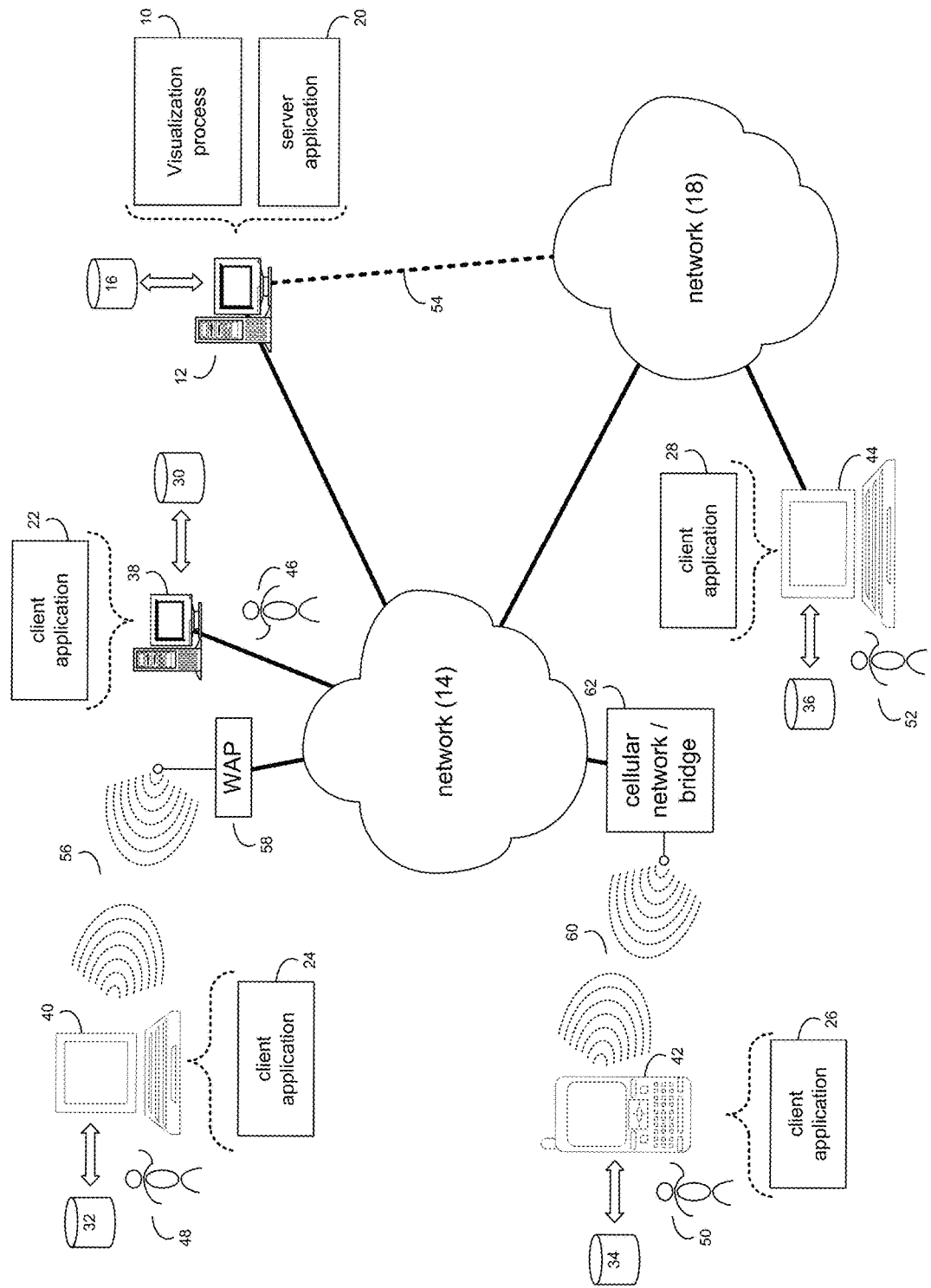
FIG. 1 diagrammatically depicts a visualization process coupled to a distributed computing network.
Figure 3:
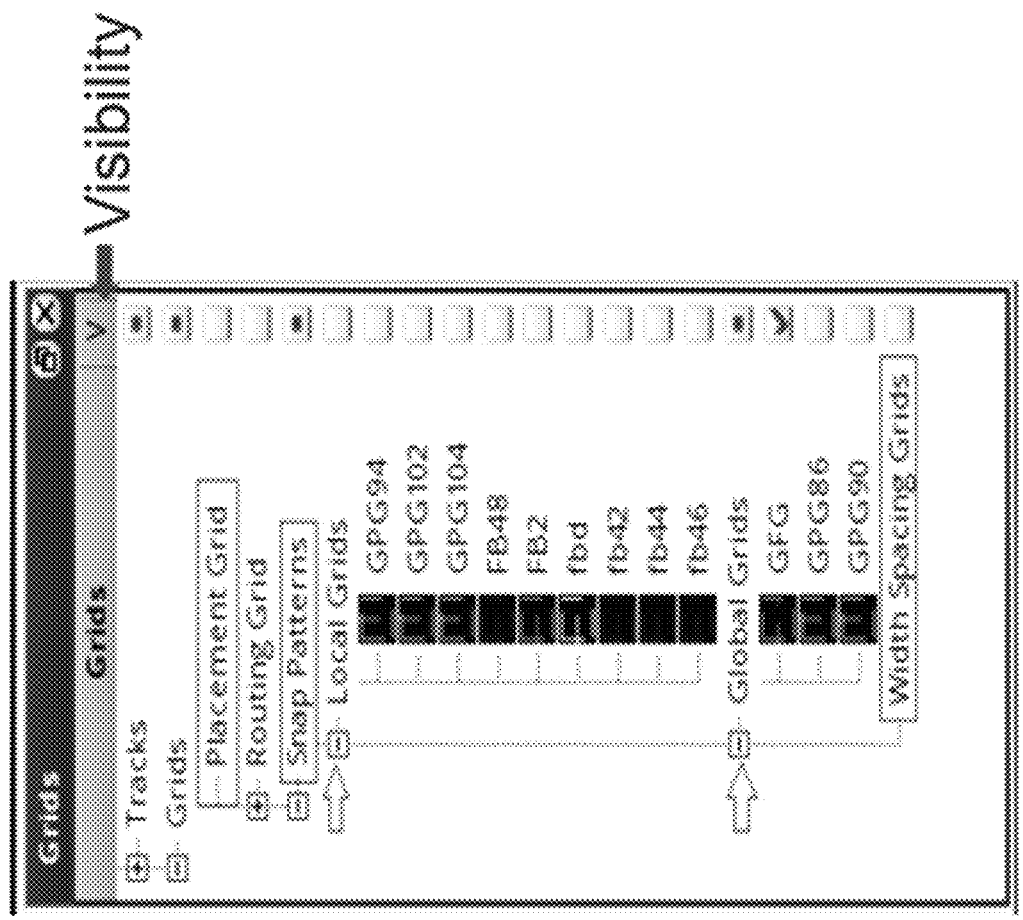
FIGS. 3-8A-8C depict exemplary graphical user interfaces according to embodiments of the present disclosure.

Embodiments of the present disclosure include a visualization process that provides an interactive visualization method that uses snapping to assist electronic designers. The term "snap", as used herein, may refer to an automatic movement at a graphical user interface, wherein an object may be transferred from one position to another without requiring user action (e.g., without requiring a user to drag an object to an exact placement, a snap may automatically move an object to one or more acceptable placements). A snap operation may be triggered based upon some user action at the graphical user interface (e.g. dragging an object at the graphical user interface to position A may result in a snap to position B, or display of a potential snap to position B, etc.). Embodiments included herein may add color coded highlights to objects which are snapped (e.g. a snap source) and where they are snapped (e.g., a snap target) thus providing a visual indication to the user. This definite color-coded scheme will help users easily identify the type of snap source and snap target. Highlights may be provided when a valid snap source overlaps a valid snap target. This may also help in determining whether snapping is successful or not. The visualization process discussed herein may be particularly useful in the snapping of collective object types such as an instance. Highlighting the individual objects (e.g., inside the instance) that snapped to the snap target may provide more precise feedback of what caused the instance to snap to that snap target as is discussed in further detail hereinbelow.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

Referring to FIG. 1, there is shown a visualization process 10 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™; or Redhat Linux™, for example. Additionally and/or alternatively, visualization process 10 may reside on a client electronic device, such as a personal computer, notebook computer, personal digital assistant, or the like.

The instruction sets and subroutines of visualization process 10, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS tm, Novell Webserver tm, or Apache Webserver tm that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute visualization process 10. Examples of client applications 22, 24, 26, 28 may include, but are not limited to, design verification tools such as those available from the assignee of the present disclosure. These applications may also be executed by server computer 12. In some embodiments, visualization process 10 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the visualization process may be a client-side application (not shown) residing on one or more client electronic devices 38, 40, 42, 44 (e.g., stored on storage devices 30, 32, 34, 36, respectively). As such, the visualization process may be a stand-alone application that interfaces with a client application (e.g., client applications 22, 24, 26, 28), or may be an applet/application that is executed within a client application. As such, the visualization process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives;

tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, visualization process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, or other wireless device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. Various telecommunications industry specifications that allows e.g., mobile phones, computers, and personal digital assistants to be interconnected using a short-range wireless connection may be used.

Client electronic devices 38, 40, 42, 44 may each execute an operating system, examples of which may include but are not limited to Microsoft Windows™, Microsoft Windows CE™, Redhat Linux™, Apple IOS, ANDROID, or a custom operating system.

Referring now to FIG. 2, a flowchart depicting an embodiment consistent with visualization process 10 is provided. Embodiments may include causing 202 a display of a portion of an electronic design at a graphical user interface and receiving 204, at the graphical user interface, a selection of an object to be moved, wherein the object is displayed in a first color. In response to a user input, the method may include moving 206 the object at the graphical user interface nearer a target location, displaying 208 at least one target type in a second color and snapping 210 the object to the target location. Numerous other operations are also within the scope of the present disclosure.

In operation, and referring also to FIGS. 3-16, a user may initiate snapping by first selecting the instance on canvas/GUI. This may be followed by initiating a command such as "Move", to move the instance from its current location to a new location by dragging the selected instance or using any other suitable approach. As the user is moving the instance, visualization process 10 may cause snapping to occur on every drag of the mouse cursor. The result of snapping is to place the instance at a nearest correct location. During the course of snapping, visualization process 10 may highlight (e.g., using the color scheme and patterns discussed in further detail hereinbelow) what inside the instance is used for snapping (e.g., snap source) and to which grid does it snap to (e.g., snap target).

In some embodiments, snapping may operate to essentially match the snap sources (shapes) to snap targets (tracks of grid). A shape may be represented by its rectangular bounding box (e.g., centerline+width). Similarly, tracks of a grid may be represented by a rectangular bounding box (e.g., centerline+width). In some cases, there may be multiple shapes in an instance separated by some distances. For example, shapes s1, s2 and s3 may be separated by a distance d1 (distance from s1 to s2) and d2 (distance from s2 to s3). Here, the width of s1 being w1, width of s2 being w2 and width of s3 being w3. In operation, visualization process 10 may first find a track closest to s1 having the same width as w1 in order to match s1. If found, visualization process 10 may look for a track of width w2 at a distance of d1 in order to match s2. If found, visualization process 10 may further look for a track of width w3 at a distance of d2 in order to match s3. A valid snap location may meet the above criteria. If any of the steps fail then visualization process 10 may look for next closest track and repeat the operations above, until a valid snap location is determined or the search space is exhausted Referring now to FIG. 3, a graphical user interface 300 showing an example display consistent with embodiments of the present disclosure is provided. GUI 300 shows examples of various tracks and grids that may be selected by a user. In some embodiments, and in accordance with visualization process 10, an object may align to different grids in the design. Some of these grids may include, but are not limited to, snap pattern (SP) grids, width spacing pattern (WSP) grids, placement grids, manufacturing grids, XY grids, rows, etc. Each of these is discussed in further detail hereinbelow.

In some embodiments, a Snap Pattern (SP) grid for a given metal layer may define the discrete locations in the design where a shape on that metal layer may be placed without creating any design rule violation. These locations may be uniformly spaced and have tracks of fixed width. Width Spacing Pattern (WSP) grids may be defined for metal layers and like SPs define the tracks in the design where a shape on the metal layer can be placed. These tracks, unlike SPs, may have different spacing and tracks widths. A shape on the metal layer is only allowed to be placed on a track with matching width. Placement grids may be uniformly spaced in the design and they define the locations where the placement boundary of the device are allowed to be placed. Manufacturing grids are defined in the technology library associated with the design. It defines the minimum allowed dimensions below which a shape cannot be manufactured. XY grids are larger grids whose value is a multiple of manufacturing grid. These grids may be displayed in the design and helps to create shapes of larger dimensions on manufacturing grid. Rows are uniformly spaced regions in the design that may be used for the placement of standard cells and devices. A row may define what kind of standard cell and device are allowed to be placed inside it and in which orientation. A standard cell of a design may be created in a fixed height/width multiple that allows placing all such designs in a row.

Embodiments of visualization process 10 may include both visible and invisible grids. Visible grids may include SP grids and WSP grids that may be seen in the GUI or canvas if the visibility of these grids has been enabled. Invisible grids may include one or more grids such as placement grids and manufacturing grids that cannot be seen in the canvas/GUI even if present in the design.

Figure 4:
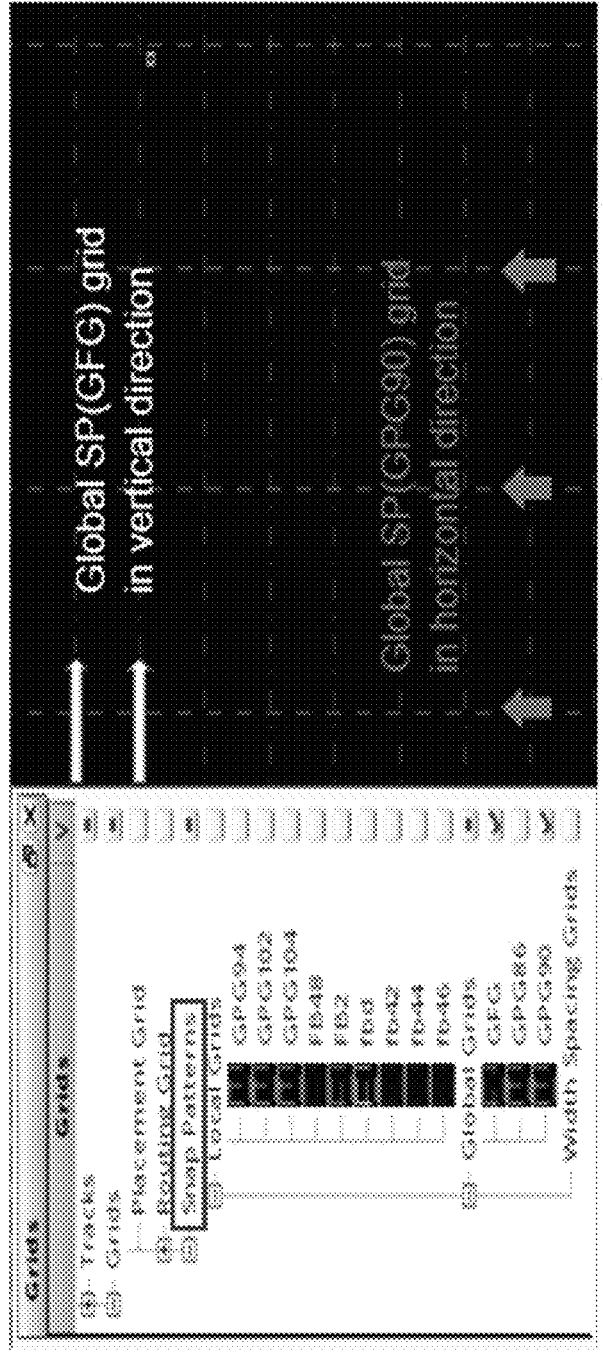
Figure 5:
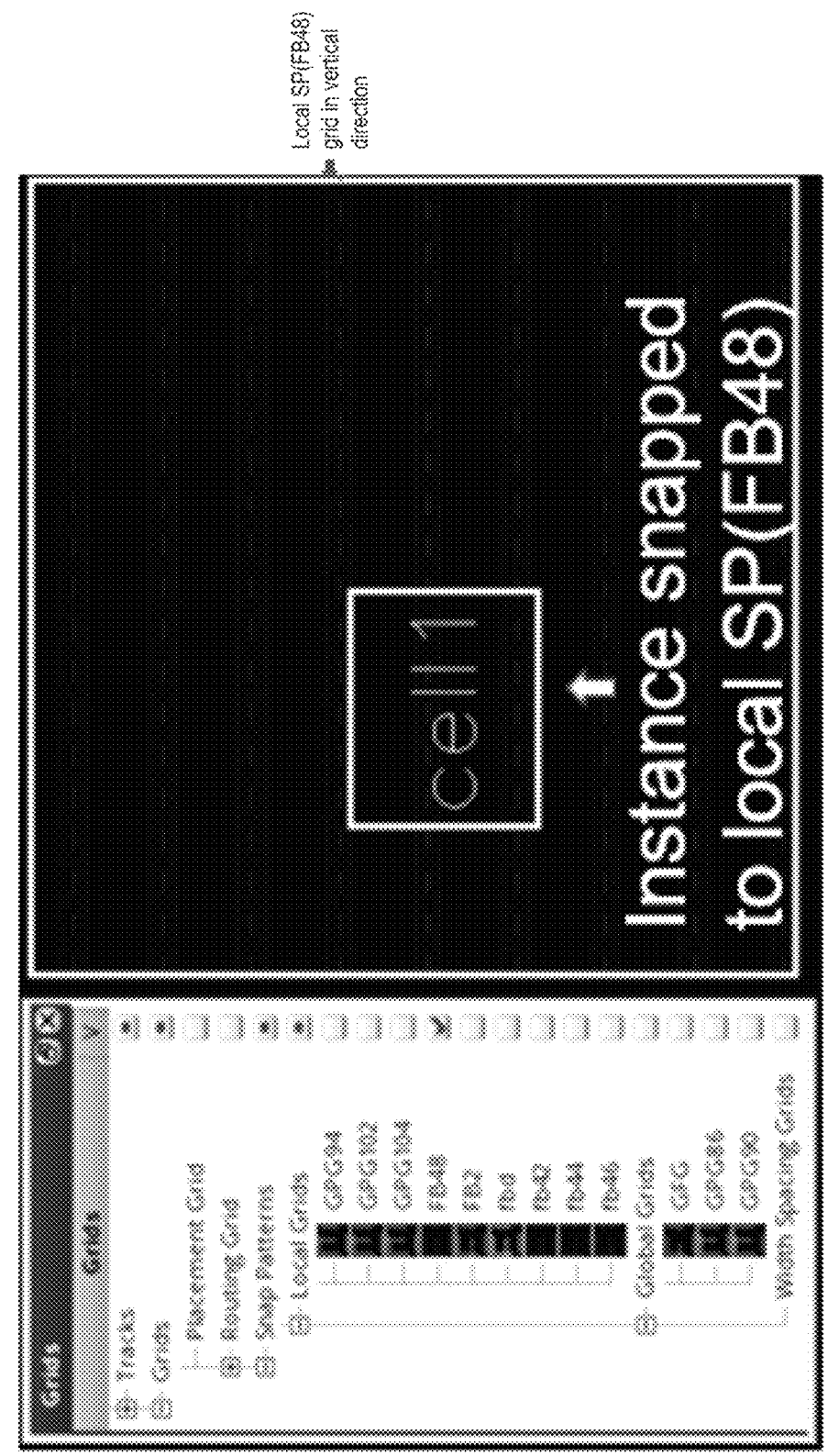
Figure 6:
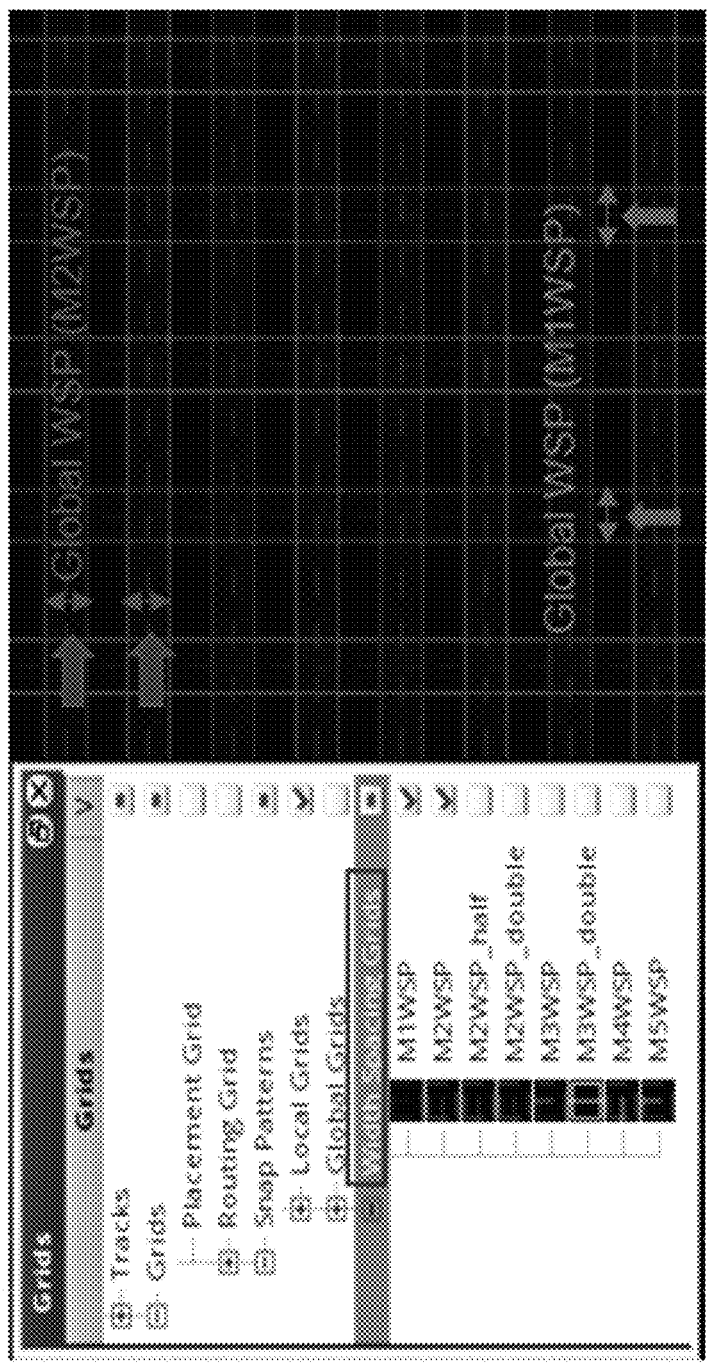
Figure 7:
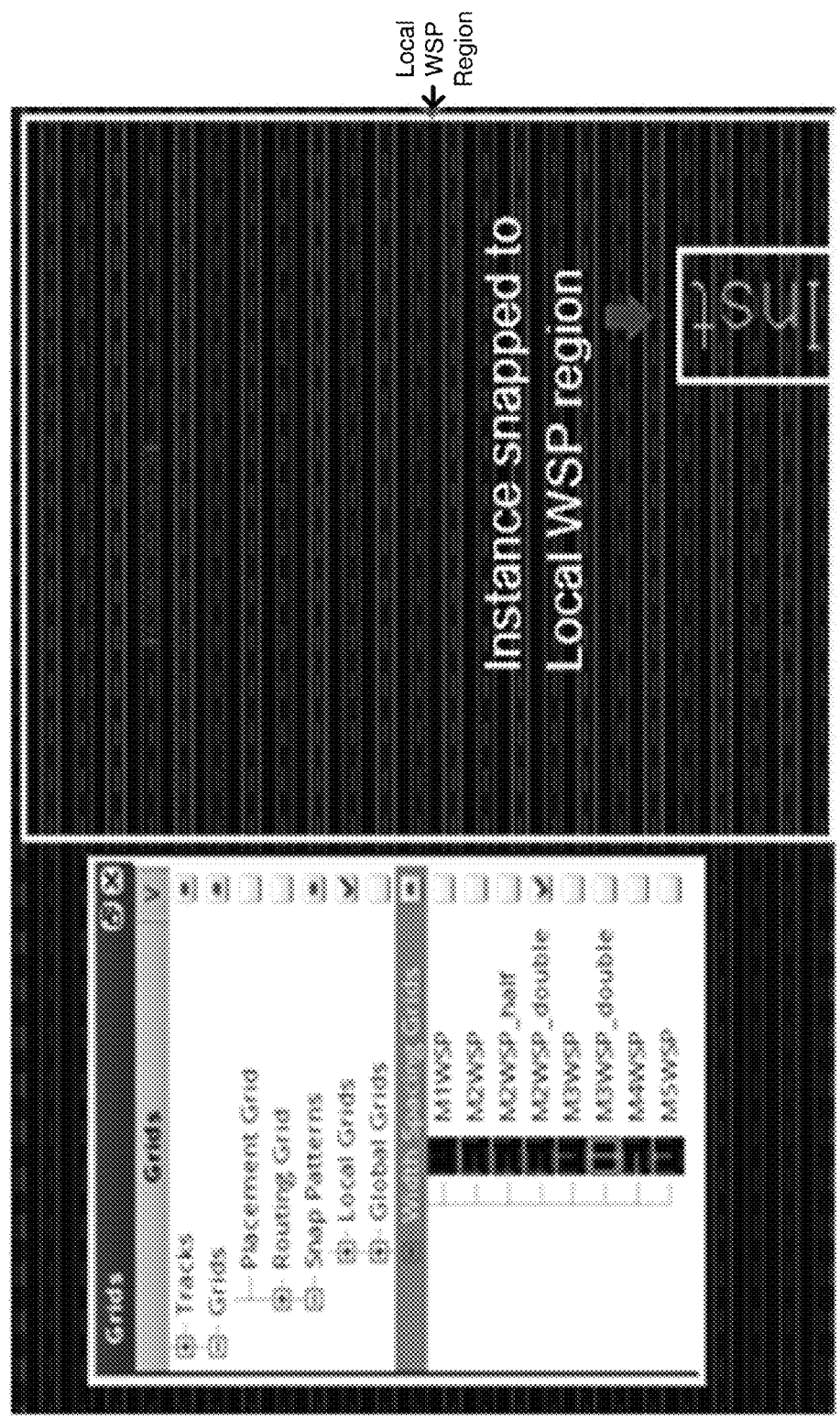

In some embodiments, and referring also to FIGS. 4-7, certain grids may be local or global. Local grids may be present in a specific area in the design while global grids are present all over the design. FIG. 4 shows a GUI 400 that depicts global SP grids in both horizontal (e.g. "GPG90") and vertical (e.g. "GFG") directions. FIG. 5 shows a GUI 500 that depicts local SP grid (e.g. "FB48") in a vertical direction with a corresponding instance (e.g. "cell 1") that has been snapped to the local SP. Similarly, FIG. 6 shows a GUI 600 that depicts global WSP grids (e.g. "M2WSP" and "MIWSP") and FIG. 7 shows a GUI 700 that depicts a local WSP region with an instance (e.g. "Inst") that has been snapped to the local WSP region.

Figure 8A:
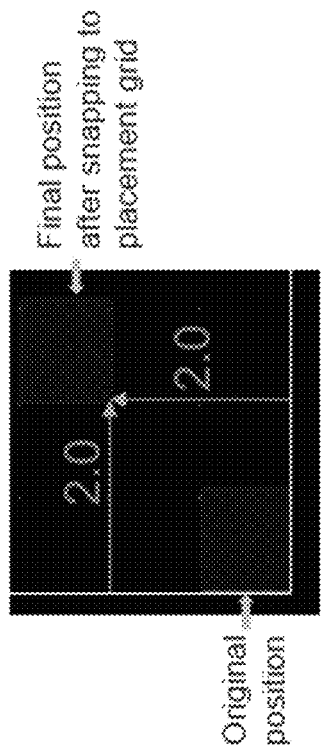
Figure 8B:
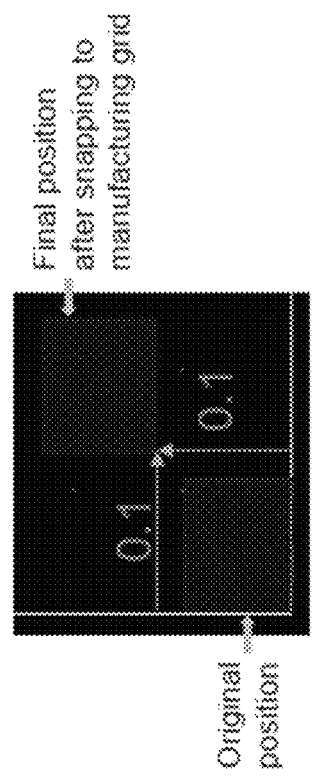
Figure 8C:
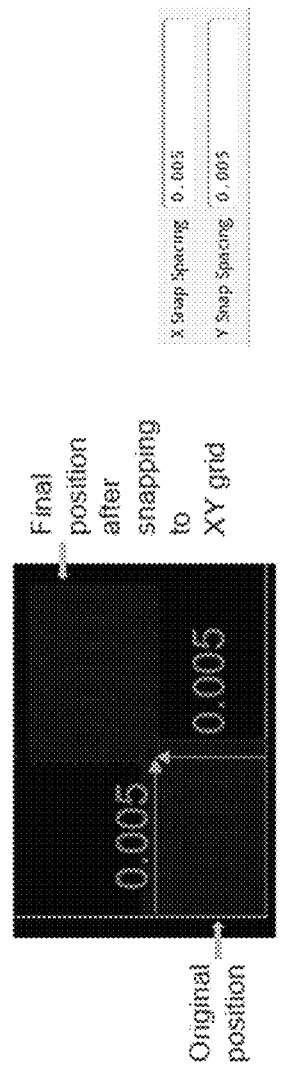

In some embodiments, and referring also to FIGS. 8A-8C, placement, manufacturing and XY grids may be global and therefore present throughout the entire electronic design. These grids may be identified as stepX and stepY value. FIGS. 8A-8C show the original position and final position after snapping to a placement, manufacturing, and XY grid respectively. For the placement grid shown in FIG. 8A:
dbGetPlacementGrid(geGetEditCellView( ))
((0.0 0.0) 2.0 2.0)
stepX=2.0
stepY=2.0
For the manufacturing grid shown in FIG. 8B:
techGetMfgGridResolution(techfile)
0.1
stepX=0.1
stepY=0.1
For the XY grid shown in FIG. 8C:
stepX=0.005
stepY=0.005

As discussed above, rows are a special kind of localized grids in the design that may be used to snap instances. Some types of rows may include, but are not limited to, oaRow, dbRow, row in a row region, Custom Placement Area (CPA), etc. Each of these is discussed in further detail hereinbelow.

Figure 9:
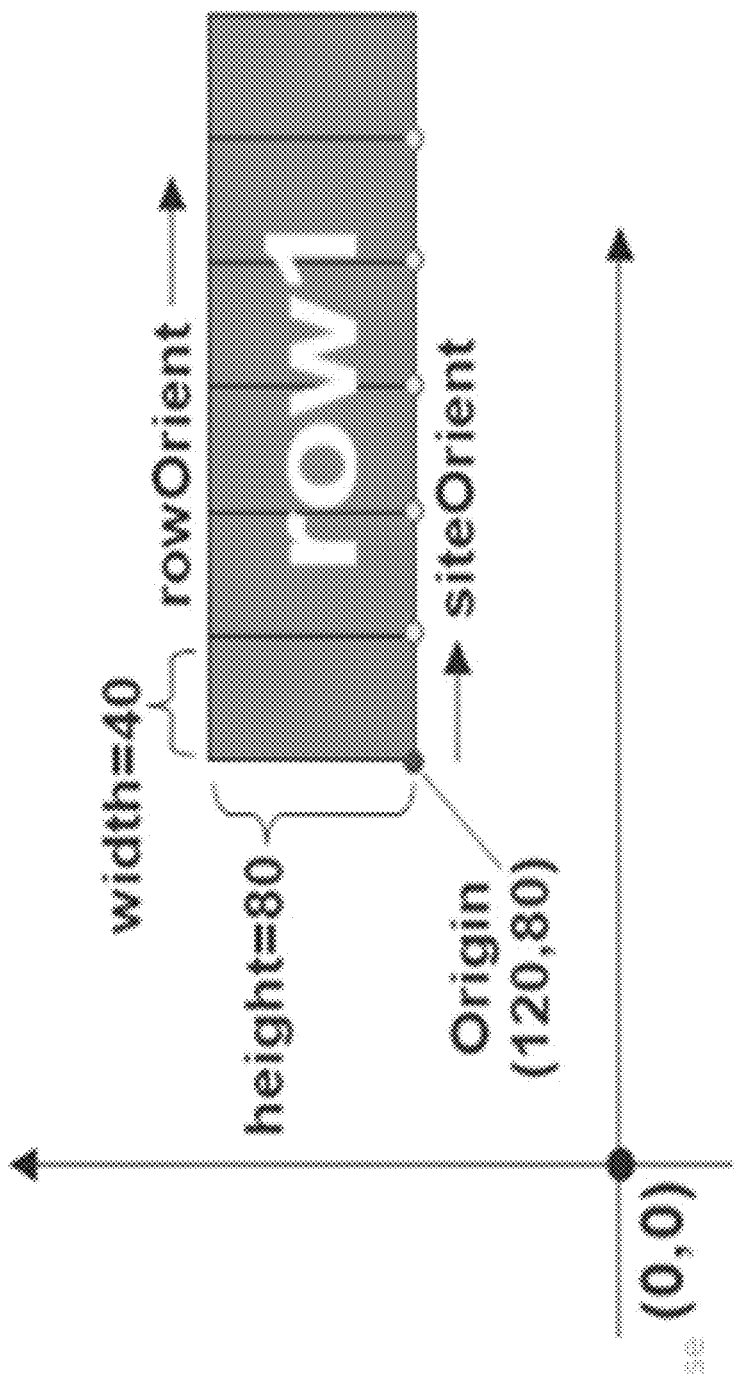
FIG. 9 depicts an example of a row according to an embodiment of the present disclosure.

In some embodiments, to assist with standard cell placement, a siteDef defines a specific width/height. An oaRow may be associated with a sitedef, implying standard cell designs matching the siteDef dimensions can be placed in the row. dbRow is an oaRow with additional information that defines the type of instances allowed to be placed inside it and in which orientation. Custom Placement Area (CPA or dbPlaceArea) is a placement area that contains additional information which controls the way in which instances can be placed inside it. A Row region is a convenience collection of dbRows and CPAs together in one construct for ease of manipulation. One particular example showing a representation of an oaRow with siteDef is shown in FIG. 9. A sitedef may define the valid location inside a row where a standard cell or a device can be placed.

In some embodiments, visualization process 10 may utilize a plurality of types of snap sources. Accordingly, some objects that may be snapped may include, but are not limited to, shape (e.g., individual shape, SP shape, shape inside an instance or figGroup, etc.), boundary (e.g., PR Boundary/Snap boundary) inside instance, instance and via (snapped as a whole), row region (type of a figGroup, snapped as a whole), composite objects such as instances may provide multiple snap sources that snap to a snap target. WSP detailed mode snapping considers multiple pins/shapes inside an instance to snap to WSP grids, etc.

In some embodiments, visualization process 10 may utilize a plurality of types of snap targets. Accordingly, some snap targets may include, but are not limited to, local SP grids, global SP grids, local WSP regions, global WSP grids, rows (e.g., oaRow, dbRow, dbPlaceArea (type of CPA), row in a row region), placement grids, manufacturing grids, XY grids, etc.

Figure 10A:
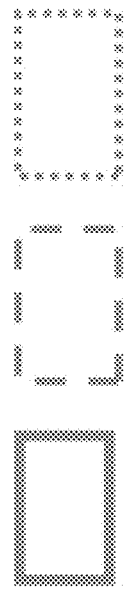
FIG. 10A-10G depicts an example showing color coding schemes according to an embodiment of the present disclosure.
Figure 10B:
Figure 10C:
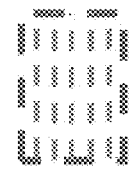
Figure 10D:
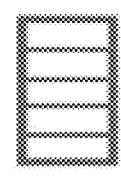
Figure 10E:
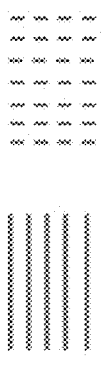
Figure 10F:
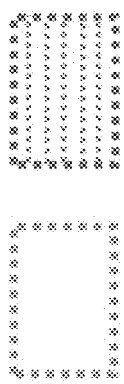
Figure 10G:
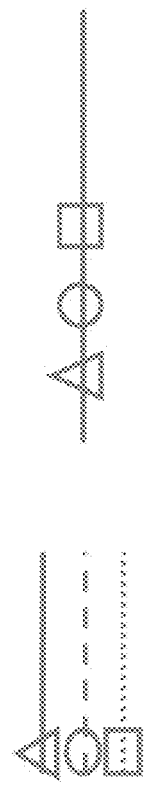

In some embodiments, and referring now to FIG. 10, visualization process 10 may utilize a highlight color coding scheme as is discussed in further detail hereinbelow. All types of snap source highlight may be in one color (e.g., orange). Multiple snap source highlights may use different line styles as shown in FIG. 10A. A snap target type may use a specific color in the highlight scheme. For example, SP Grids in blue, WSP Grids in pink, row outline in pink as shown in FIGS. 10B, 10C and 10D respectively. In a situation where there are multiple snap sources or snap targets, a different style will help differentiate between different source or target. For example, a solid line may be used for one target and a dashed line for another target as shown in FIG. 10E. In some embodiments, the style of the source may depend on the style of the target. For example, dotted lines for a source to match a dotted line target as shown in FIG. 10F. If there are overlapping targets, one or more markers may be drawn to show the overlap as shown in FIG. 10G. For example, where two or more WSP grids overlap at a location. In this way, a triangle legend may be used for one grid, a circle marker for another grid and a square marker as shown in FIG. 10G.

Figure 11:
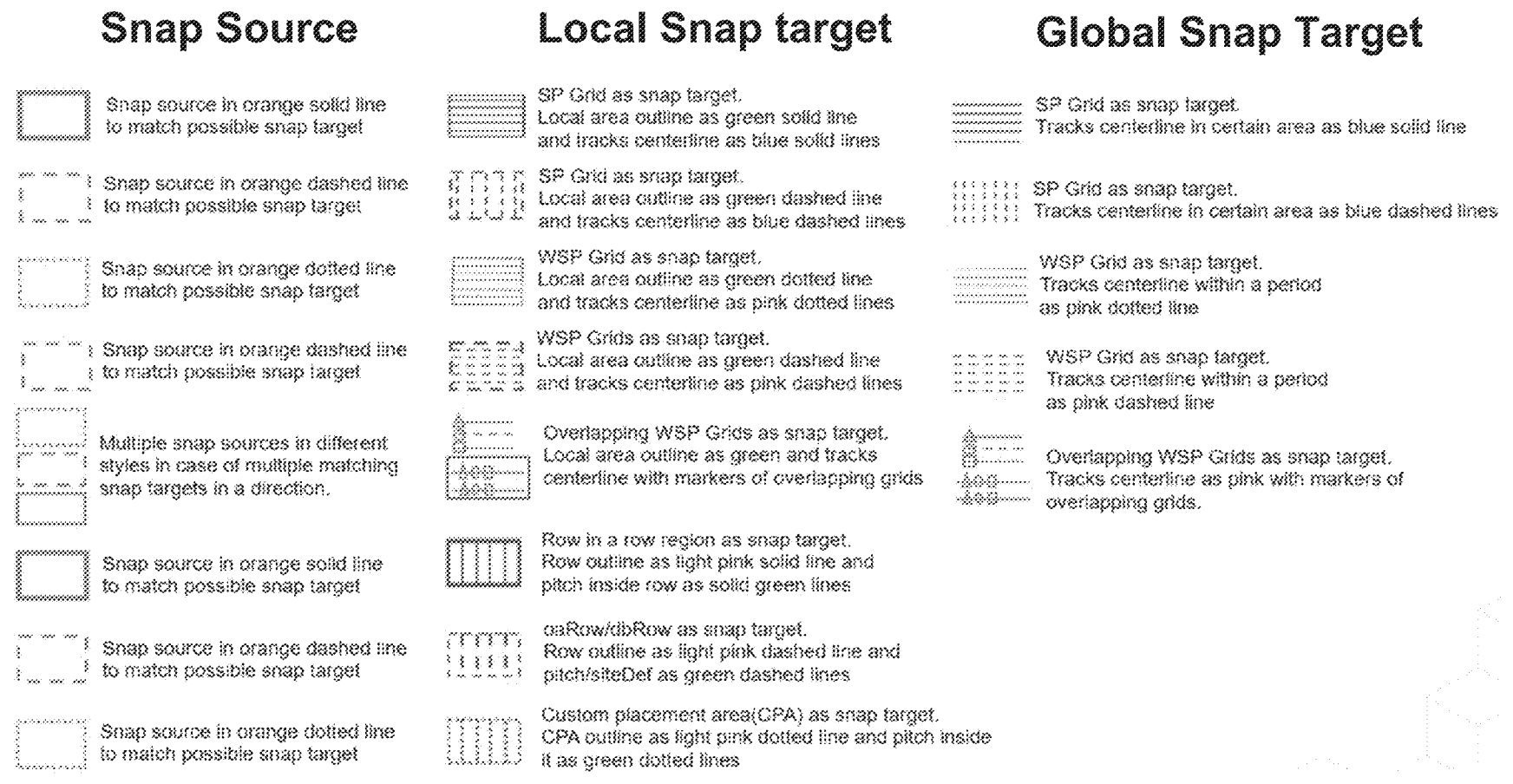

Referring now to FIG. 11, a diagram showing an example of snap source and target color coding highlights is provided. More specifically snap source, local snap target, and global snap target color coding schemes are provided. It should be noted that these illustrations are provided merely by way of example as many variations are possible without departing from the scope of the present disclosure.

Figure 12:
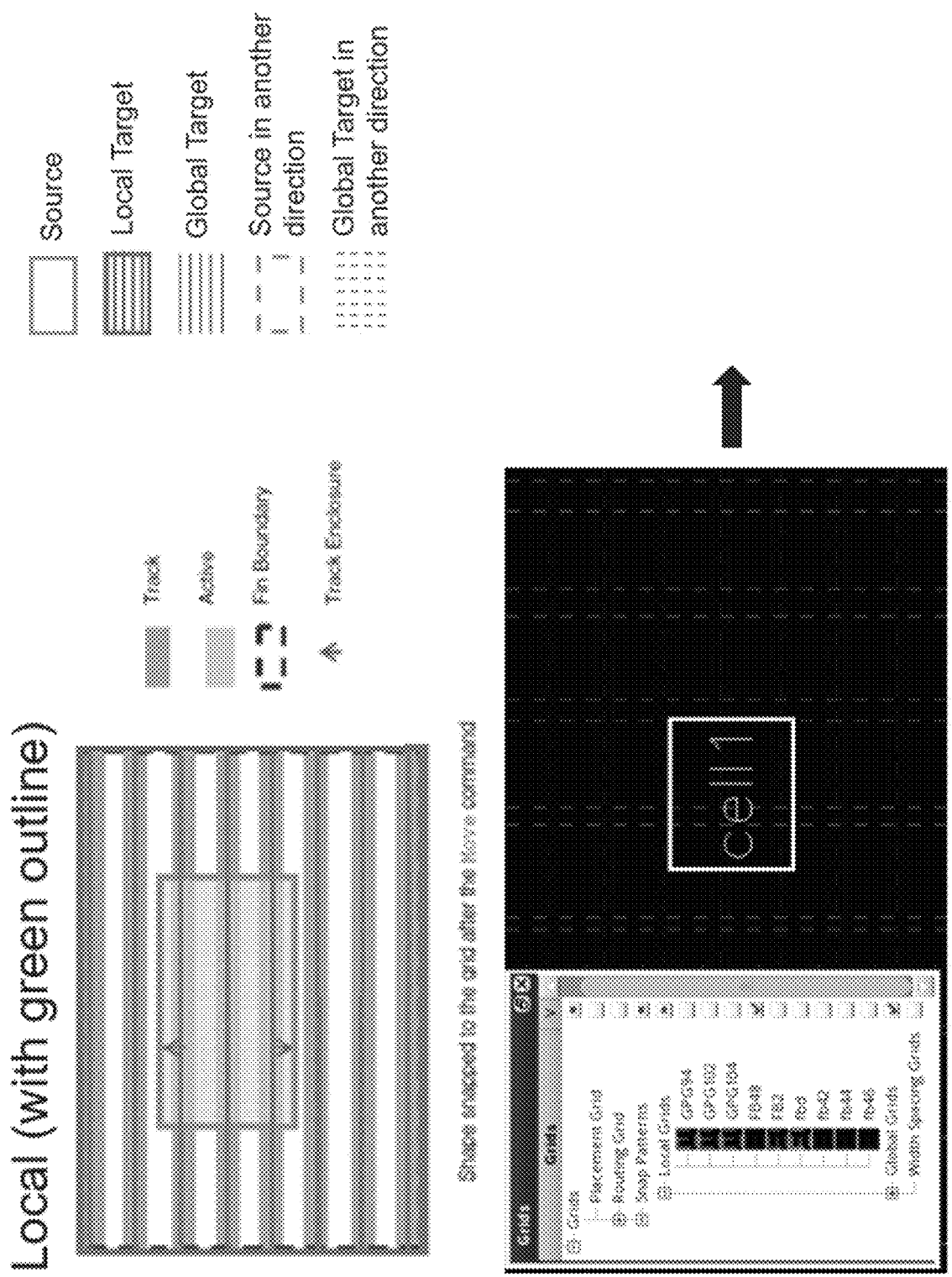
Figures 14A, 14B:
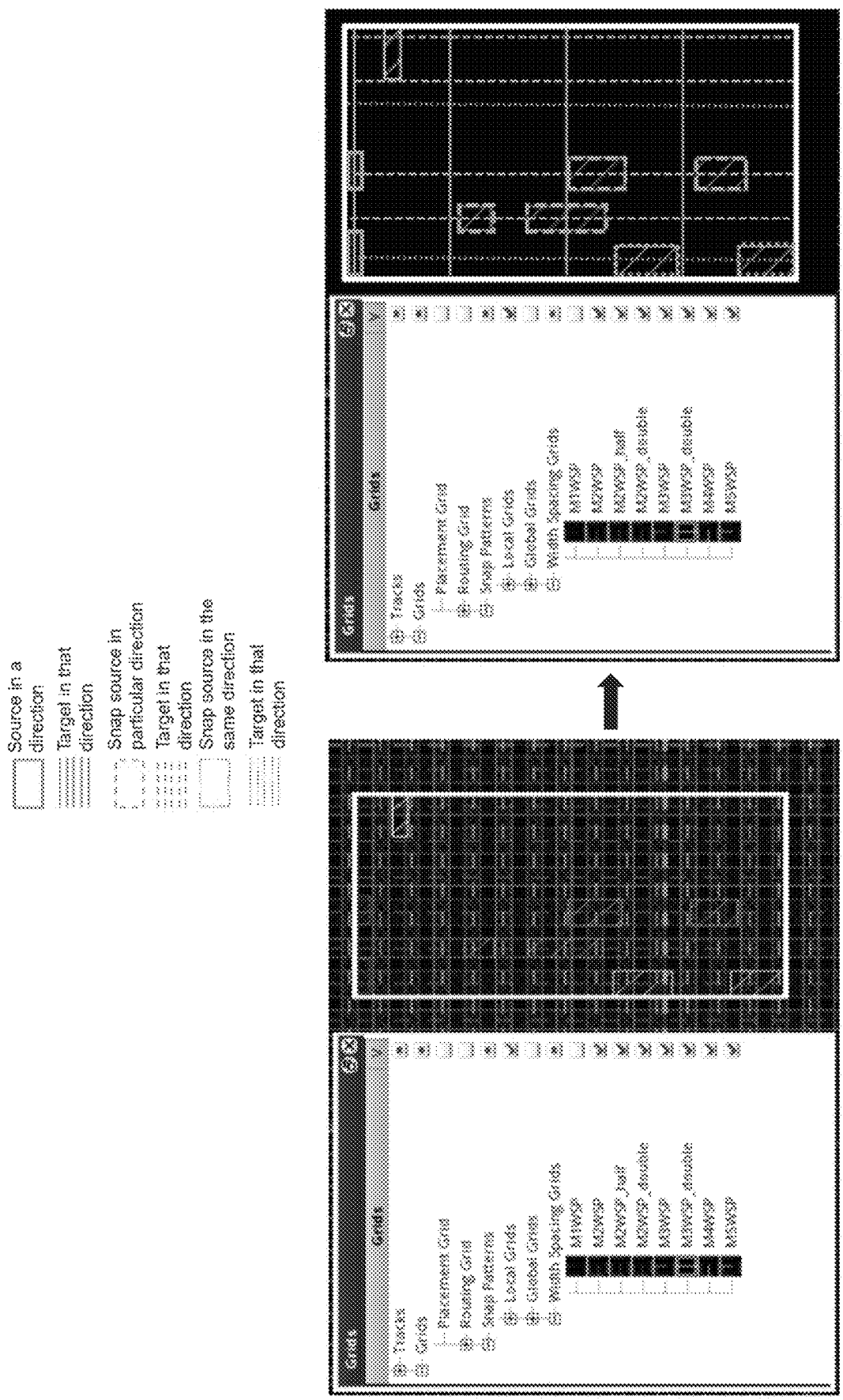

Referring now to FIGS. 12-13, various graphical user interfaces are provided that depict an example showing snapping to local/global SP grids. More specifically, FIG. 12 shows a current display with an instance ("cell1") snapped to an SP grid with multiple grids active in the design. FIG. 13 shows a proposed display with a source (multiple objects inside instance ("cell1") responsible for snapping in different directions) and targets (SP Grids) with highlights. Referring now to FIG. 14, various graphical user interfaces are provided that depict an example showing snapping to WSP Grids. In operation, for WSP snapping, there may be multiple snap source and snap targets in a particular direction. In some embodiments, a different highlighting style may be drawn to show different grids in a direction and a snap source matching the target style. In the particular example of FIG. 14, the pins (on metal2) are shown snapping to the M2WSP grid in a horizontal direction and the pins (on metal5) snapping to the M5WSP grid. The pins (on metal3) are shown snapping to the M3WSP grid both in vertical direction. FIG. 14A shows the current display with an instance snapped to some WSP grids with multiple grids active in the design. FIG. 14B shows a proposed display with sources (e.g., objects responsible for snapping) in orange with matching styles as targets (e.g., WSP Grids) in pink highlights according to the color coded scheme.

Figure 15A:
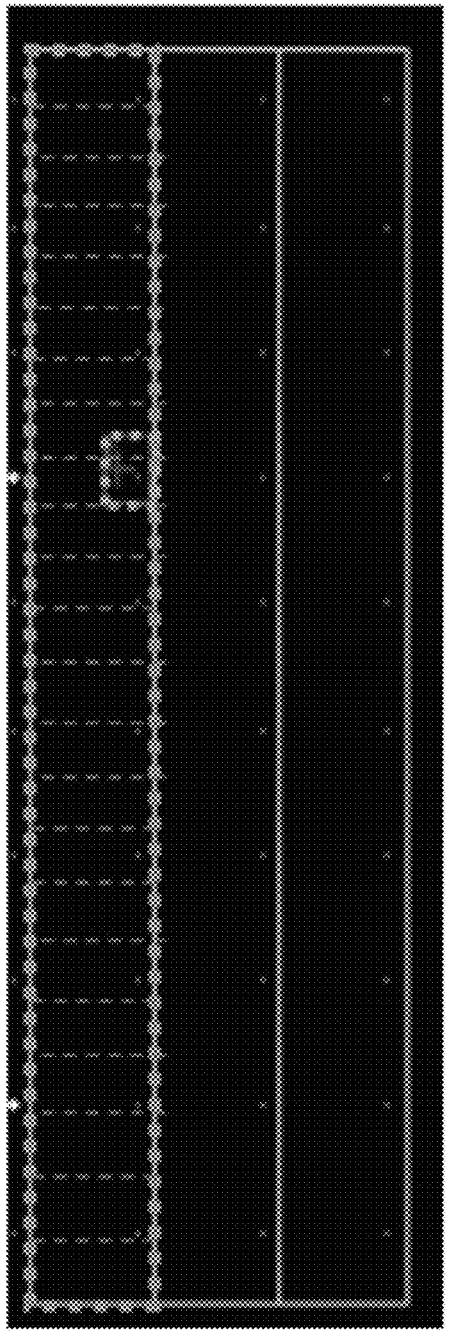
Figure 15B:
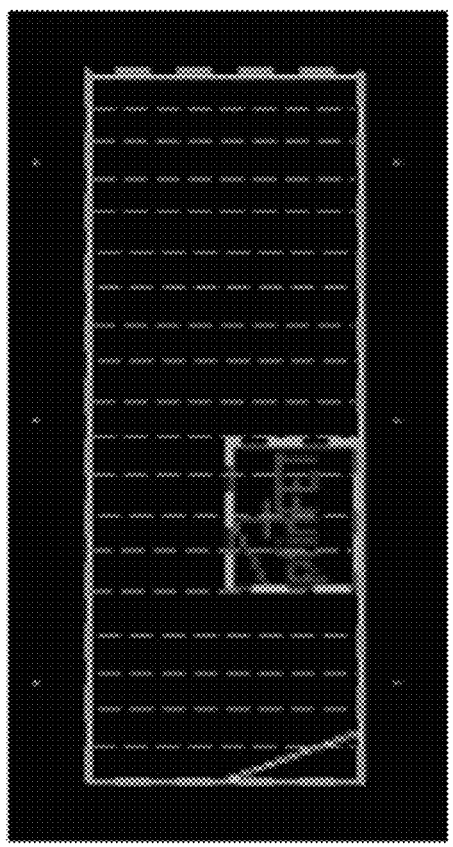
Figure 16B:
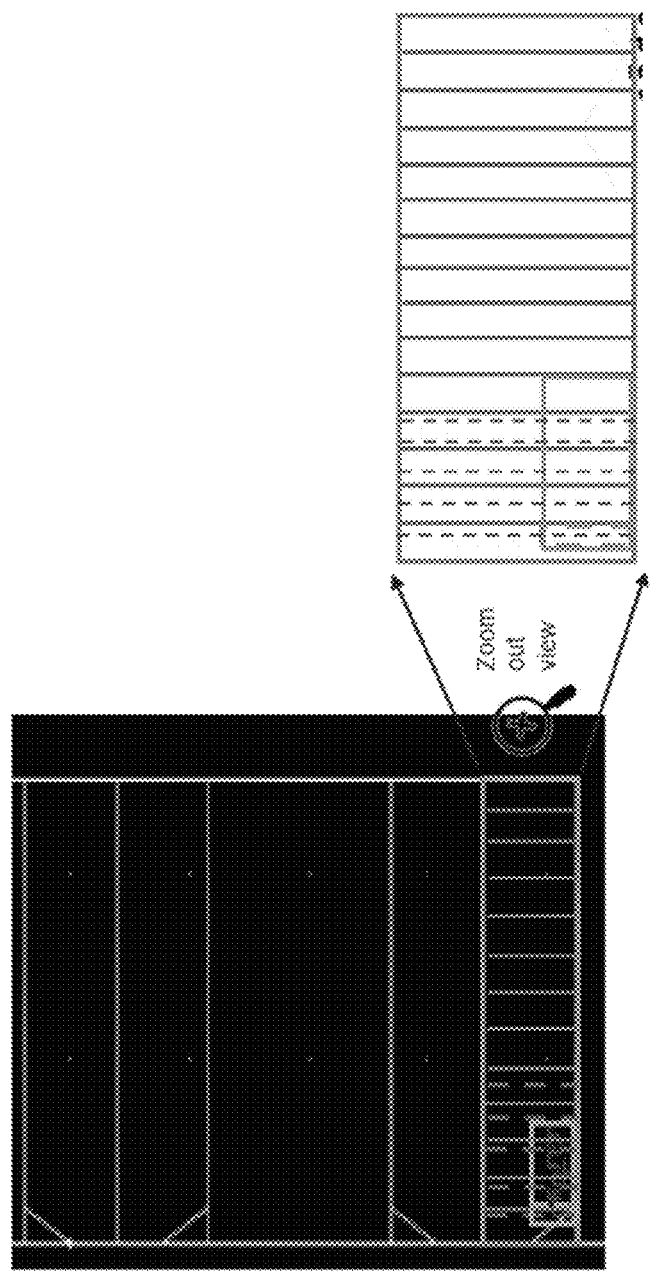
Figure 16A:
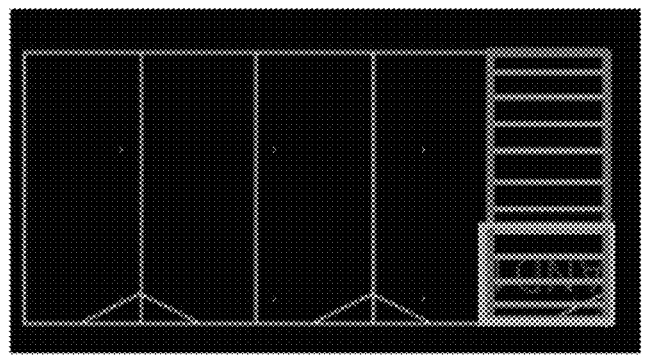

Referring now to FIGS. 15-16, graphical user interfaces are provided showing snapping to various types of rows. FIG. 15A shows a CPA as a snap target and FIG. 15B shows an oaRow as a snap target. FIG. 16A shows a row in a row region as a snap target and FIG. 16B shows a row in a row region as a snap target (e.g., pink highlight with pitch in green solid lines) in one direction and SP grids as snap target (dashed blue lines) in another direction.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method comprising:
    causing a display of a portion of an electronic design at a graphical user interface;
    receiving, at the graphical user interface, a selection of an object to be moved, wherein the object is displayed in a first color;
    in response to a user input, moving the object at in the graphical user interface near a target at a target location;
    displaying at least one target type in a second color; and
    snapping the object to the target at the target location, wherein the snapping includes causing a display of a potential target having a first line style matching a second line style of the object.

2. The computer-implemented method of claim 1, wherein the object is at least one of a shape, a boundary, an instance, a row, a via, or a composite object.

3. The computer-implemented method of claim 1, wherein the target is at least one of a local snap pattern grid, a global snap pattern grid, a local width spacing pattern region, a global width spacing pattern grid, a placement grid, a manufacturing grid, or an XY grid.

4. The computer-implemented method of claim 3, wherein the at least one target type includes a plurality of target types, wherein each target type is displayed in a distinct color.

5. The computer-implemented method of claim 1, wherein the object is assigned a distinct line style based upon, at least in part, one or more grids.

6. The computer-implemented method of claim 1, wherein displaying at least one target type includes displaying a plurality of target types in distinct colors simultaneously.

7. The computer-implemented method claim 1, wherein the target is a row.

8. A non-transitory computer-readable storage medium having stored thereon instructions that when executed by a machine result in following operations:
    causing a display of a portion of an electronic design at a graphical user interface;
    receiving, at the graphical user interface, a selection of an object to be moved, wherein the object is displayed in a first color;
    in response to a user input, moving the object at in the graphical user interface near a target at a target location;
    displaying at least one target type in a second color; and
    snapping the object to the target at the target location, wherein the snapping includes highlighting a potential target and the object with a same line style.

9. The non-transitory computer-readable storage medium of claim 8, wherein the object is at least one of a shape, a boundary, an instance, a row, a via, or a composite object.

10. The non-transitory computer-readable storage medium of claim 8, wherein the target is at least one of a local snap pattern grid, a global snap pattern grid, a local width spacing pattern region, a global width spacing pattern grid, a placement grid, a manufacturing grid, or an XY grid.

11. The non-transitory computer-readable storage medium of claim 10, wherein the at least one target type includes a plurality of target types, wherein each target type is displayed in a distinct color.

12. The non-transitory computer-readable storage medium of claim 8, wherein the object is assigned a distinct line style based upon, at least in part, one or more grids.

13. The non-transitory computer-readable storage medium of claim 8, wherein displaying at least one target type includes displaying a plurality of target types in distinct colors simultaneously.

14. The non-transitory computer-readable storage medium of claim 8, wherein the target is a row.

15. A system comprising:
    a memory; and
    at least one processor configured to cause a display of a portion of an electronic design at a graphical user interface, the at least one processor configured to receive, at the graphical user interface, a selection of an object to be moved, wherein the object is displayed in a first color, wherein in response to a user input, the at least one processor is further configured to move the object at the graphical user interface near a target at a target location, the at least one processor further configured to display at least one target type in a second color and to snap the object to the target at the target location, wherein the snapping includes highlighting a potential target and the object with a same line style.

16. The system of claim 15, wherein the object is at least one of a shape, a boundary, an instance, a row, a via, or a composite object.

17. The system of claim 15, wherein the target is at least one of a local snap pattern grid, a global snap pattern grid, a local width spacing pattern region, a global width spacing pattern grid, a placement grid, a manufacturing grid, or an XY grid.

18. The system of claim 17, wherein the at least one target type includes a plurality of target types, wherein each target type is displayed in a distinct color.

19. The system of claim 15, wherein the object is assigned a distinct line style based upon, at least in part, one or more grids.

20. The system of claim 15, wherein displaying at least one target type includes displaying a plurality of target types in distinct colors simultaneously.

* * * * *